US011503235B2

(12) United States Patent
Kawai

(10) Patent No.: US 11,503,235 B2
(45) Date of Patent: *Nov. 15, 2022

(54) SOLID-STATE IMAGING ELEMENT AND ELECTRONIC DEVICE

(71) Applicant: SONY SEMICONDUCTOR SOLUTIONS CORPORATION, Kanagawa (JP)

(72) Inventor: Nobuhiro Kawai, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/073,898

(22) Filed: Oct. 19, 2020

(65) Prior Publication Data

US 2021/0037200 A1 Feb. 4, 2021

Related U.S. Application Data

(63) Continuation of application No. 16/349,035, filed as application No. PCT/JP2017/040942 on Nov. 14, 2017, now Pat. No. 10,855,941.

(30) Foreign Application Priority Data

Dec. 9, 2016 (JP) .................................. 2016-239152

(51) Int. Cl.
*H04N 5/363* (2011.01)
*H04N 5/369* (2011.01)
(Continued)

(52) U.S. Cl.
CPC ........... *H04N 5/363* (2013.01); *H01L 27/146* (2013.01); *H01L 27/14603* (2013.01);
(Continued)

(58) Field of Classification Search
CPC . G03B 13/36; G03B 5/02; G03B 5/00; G03B 2205/0076; G03B 2205/0007;
(Continued)

(56) References Cited

U.S. PATENT DOCUMENTS 6,657,665 B1   12/2003  Guidash
2009/0322921 A1  12/2009  Ishimoto et al.
(Continued)

FOREIGN PATENT DOCUMENTS

CN         106063253 A    10/2016
JP         2012-502469 A    1/2012
(Continued)

OTHER PUBLICATIONS

International Search Report and Written Opinion of PCT Application No. PCT/JP2017/040942, dated Dec. 26, 2017, 08 pages of English Translation and 08 pages of ISRWO.
(Continued)

*Primary Examiner* — Timothy J Henn
(74) *Attorney, Agent, or Firm* — Chip Law Group

(57) ABSTRACT

A solid-state imaging element of the present disclosure a pixel. The pixel includes a charge accumulation unit that accumulates a charge photoelectrically converted by a photoelectric conversion unit, a reset transistor that selectively applies a reset voltage to the charge accumulation unit, an amplification transistor having a gate electrode electrically connected to the charge accumulation unit, and a selection transistor connected in series to the amplification transistor. Additionally, the solid-state imaging element includes a first wiring electrically connecting the charge accumulation unit and the gate electrode of the amplification transistor, a second wiring electrically connected to a common connection node of the amplification transistor and the selection transistor and formed along the first wiring, and a third (Continued)

wiring electrically connecting the amplification transistor and the selection transistor.

18 Claims, 10 Drawing Sheets

(51) Int. Cl.
*H01L 27/28* (2006.01)
*H01L 27/30* (2006.01)
*H04N 5/361* (2011.01)
*H04N 5/3745* (2011.01)
*H01L 27/146* (2006.01)
*H04N 5/374* (2011.01)

(52) U.S. Cl.
CPC ...... *H01L 27/14612* (2013.01); *H01L 27/286* (2013.01); *H01L 27/307* (2013.01); *H04N 5/361* (2013.01); *H04N 5/369* (2013.01); *H04N 5/3698* (2013.01); *H04N 5/374* (2013.01); *H04N 5/379* (2018.08); *H04N 5/3745* (2013.01); *H01L 27/14647* (2013.01); *H01L 27/14665* (2013.01)

(58) Field of Classification Search
CPC .. G03B 2205/0069; G03B 30/00; G03B 3/10; G03B 3/02; G03B 3/00; G01P 15/02; G02B 7/08; G02B 7/04; G02B 27/646; G02B 7/09; G02B 7/282; F03G 7/065; H04N 5/2251; H04N 5/2257; H04N 5/2253; H04N 5/2254; H04N 5/2252; H02K 41/0354; H02K 41/0356; H02K 41/035; H02K 33/18
See application file for complete search history.

(56) References Cited

U.S. PATENT DOCUMENTS

| | | |
|---|---|---|
| 2013/0009038 A1 | 1/2013 | Ishii |
| 2015/0076327 A1 | 3/2015 | Amikawa et al. |
| 2017/0019618 A1 | 1/2017 | Koga |
| 2017/0280080 A1 | 9/2017 | Machida et al. |
| 2018/0115727 A1 | 4/2018 | Yanagita et al. |

FOREIGN PATENT DOCUMENTS

| | | | |
|---|---|---|---|
| JP | 2013-009207 A | 1/2013 | |
| JP | 2015-177323 A | 10/2015 | |
| KR | 10-2016-0133412 A | 11/2016 | |
| TW | 201535698 A | 9/2015 | |
| WO | 2013/179597 A1 | 12/2013 | |
| WO | 2015/137147 A1 | 9/2015 | |
| WO | WO-2015137147 A1 * | 9/2015 | ............. H04N 5/374 |

OTHER PUBLICATIONS

Non-Final Office Action for U.S. Appl. No. 16/349,035, dated Apr. 16, 2020, 10 pages.
Notice of Allowance for U.S. Appl. No. 16/349,035, dated Jul. 28, 2020, 07 pages.
Notice of Allowance for U.S. Appl. No. 16/349,035, dated Sep. 23, 2020, 03 pages.
International Preliminary Report on Patentability of PCT Application No. PCT/JP2017/040942, dated Jun. 20, 2019, 09 pages of English Translation and 05 pages of IPRP.
Office Action for JP Patent Application No. 2018-554888, dated Sep. 28, 2021, 05 pages of English Translation and 05 pages of Office Action.

* cited by examiner

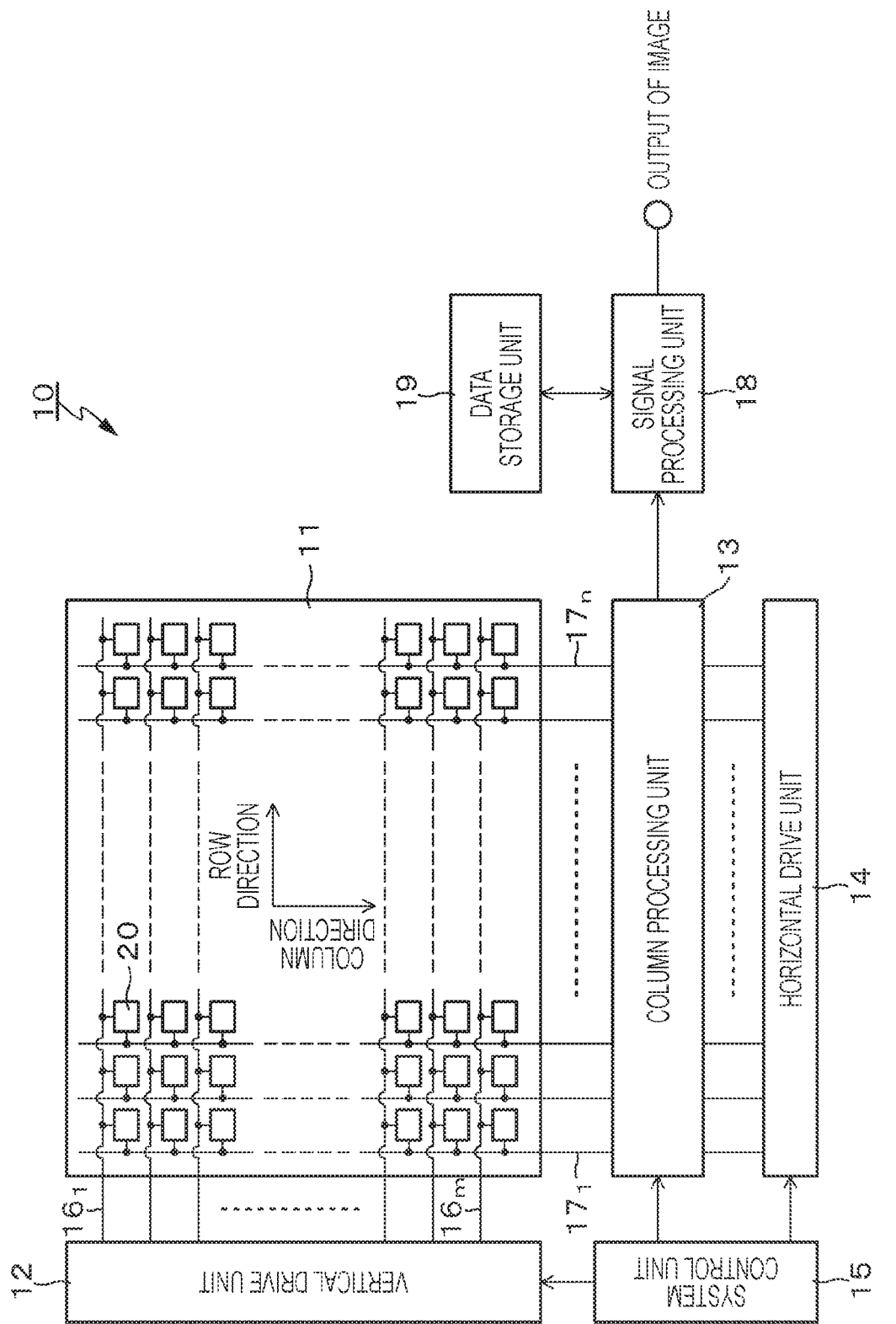

SOLID-STATE IMAGING ELEMENT AND ELECTRONIC DEVICE

CROSS REFERENCE TO RELATED APPLICATIONS

This application is continuation application of U.S. patent application Ser. No. 16/349,035, filed on May 10, 2019, which is a U.S. National Phase of International Patent Application No. PCT/JP2017/040942 filed on Nov. 14, 2017, which claims priority benefit of Japanese Patent Application No. JP 2016-239152 filed in the Japan Patent Office on Dec. 9, 2016. Each of the above-referenced applications is hereby incorporated herein by reference in its entirety.

TECHNICAL FIELD

The present disclosure relates to a solid-state imaging element and an electronic device.

BACKGROUND ART

In a complementary metal oxide semiconductor (CMOS) image sensor, one example of a solid-state imaging element, a floating diffusion unit (hereinafter, referred to as a "FD unit") is in a floating state when a reset pulse is returned to an inactive state after FD unit has been reset. Therefore, feedthrough corresponding to capacitive coupling lowers a voltage of the FD unit.

Furthermore, when the reset pulse is returned to the inactive state, charge injection, that is, a phenomenon in which electrons existing in a channel of a reset transistor are injected into the FD unit also occurs, and this phenomenon also lowers the voltage of the FD unit (hereinafter referred to as "FD voltage") in a similar manner. The FD voltage drop would deteriorate readout of electrons from a photoelectric conversion unit, and therefore, there is a need to perform pixel design in consideration of the amount of drop in the FD voltage.

As a pixel design in consideration of the FD voltage drop, it is conceivable to enhance routing of wiring within a pixel and use coupling accompanying a potential change of the wiring. Conventionally, as a technique to enhance routing of wiring within a pixel, there is a technique in which shield wiring is provided below the FD wiring and the shield wiring is conductively connected to an output terminal of a source follower amplifier (refer to Patent Document 1, for example).

CITATION LIST

Patent Document

Patent Document 1: Japanese Patent Application National Publication (Laid-Open) No. 2012-502469

SUMMARY OF THE INVENTION

Problems to be Solved by the Invention

Meanwhile, in a typical CMOS image sensor, merely the feedthrough of the reset pulse and the charge injection in the reset transistor has influence of the voltage drop after resetting of the FD unit, and the signal charge stays in the FD unit for several microseconds. Accordingly, the FD unit is not easily influenced by electric field dark current such as junction leakage.

On the other hand, in a case where the charge accumulation unit cannot be depleted, for example, in a case where an organic photoelectric conversion film is used in a photoelectric conversion unit and one of the accompanying electrodes is connected to the FD unit, it is necessary to accumulate a signal charge in the FD unit. Therefore, the dark current of the FD unit is also accumulated together with accumulation of the signal charge. Furthermore, in the configuration using an organic film, a time interval of correlated double sampling (CDS) processing of the signals before and after accumulation is equal to the signal accumulation time. Therefore, after readout of the level before accumulation, the selection pulse is turned into an inactive state and enters a long accumulation phase.

Meanwhile, in a case where the signal charge is accumulated in the FD unit, the FD unit can be reset with GND in order to reduce the dark current. This can reduce a voltage difference between the voltage of the FD unit and voltage of the semiconductor substrate in the dark condition and weaken the electric field, enabling reduction of the dark current. However, in addition to the feedthrough by the reset pulse and the channel charge injection in the reset transistor as described above, the feedthrough due to the selection pulse lowers the FD voltage as well. This causes a voltage difference between the FD unit and the semiconductor substrate, and the electric field generated by this would increase the dark current in the FD unit. In order to avoid the influence of these feedthrough and channel charge injection, it is conceivable to adjust the reset voltage in consideration of the feedthrough amount. However, it is necessary to consider the influence of an increase in cost and power consumption to be caused by an increase in bias voltage and the number of power supply units, for example.

According to the above-described conventional technique described in Patent Document 1, shielding the FD wiring by the shield wiring biased with the output of the source follower amplifier can increase a voltage charge conversion ratio. However, the conventional technique described in Patent Document 1 has not taken into consideration avoidance of the influence of the feedthrough due to the reset pulse, the channel charge injection in the reset transistor, nor the feedthrough due to the selection pulse.

The present disclosure aims to provide a solid-state imaging element and an electronic device capable of avoiding the influence of feedthrough by the reset pulse, channel charge injection in a reset transistor, and feedthrough due to a selection pulse.

Solutions to Problems

According to an embodiment of the present disclosure, a solid-state imaging element having arranged inside a pixel: a charge accumulation unit that accumulates a charge photoelectrically converted by a photoelectric conversion unit; a reset transistor that selectively applies a reset voltage to the charge accumulation unit; an amplification transistor having a gate electrode being electrically connected to the charge accumulation unit; and a selection transistor connected in series to the amplification transistor, the solid-state imaging element including: first wiring electrically connecting the charge accumulation unit and the gate electrode of the amplification transistor; second wiring electrically connected to a common connection node of the amplification transistor and the selection transistor and formed along the first wiring; and third wiring electrically connecting the amplification transistor and the selection transistor. Moreover, an electronic device provided for achieving the above-described purpose according to the present disclosure includes a solid-state imaging element having the above-described configuration.

In the solid-state imaging element having the above-described configuration or the electronic device including the solid-state imaging element, since the second wiring is formed along the first wiring, it is possible to increase capacitive coupling between the first wiring and the second wiring via parasitic capacitance. Moreover, since the second wiring is connected to the common connection node of the amplification transistor and the selection transistor, it is possible to boost an FD voltage by the capacitive coupling between the first wiring and the second wiring, enabling adjustment of voltage of the charge accumulation unit to an appropriate value. Furthermore, since the amplification transistor and the selection transistor are connected to each other by the third wiring rather than by sharing a diffusion layer, the degree of freedom of the layout of the selection transistor is increased. In addition, since the selection transistor is disposed at a position distant from the charge accumulation unit, it is possible to suppress a voltage drop of the charge accumulation unit due to the influence of the feedthrough due to the selection pulse, as compared with the case where the diffusion layer is shared.

Effects of the Invention

According to the present disclosure, it is possible to avoid influence of a feedthrough by a reset pulse, channel charge injection in a reset transistor, and a feedthrough due to a selection pulse, enabling adjustment of the voltage of the charge accumulation unit to an appropriate value.

Note that effects described herein are non-limiting. The effects may be any effects described in the present description. Note that effects described herein are provided for purposes of exemplary illustration and are not intended to be limiting. Still other additional effects may also be contemplated.

BRIEF DESCRIPTION OF DRAWINGS

FIG. 1 is a system configuration diagram illustrating a basic configuration of a solid-state imaging element to which the technology of the present disclosure is applied.

MODE FOR CARRYING OUT THE INVENTION

Figure 2A:
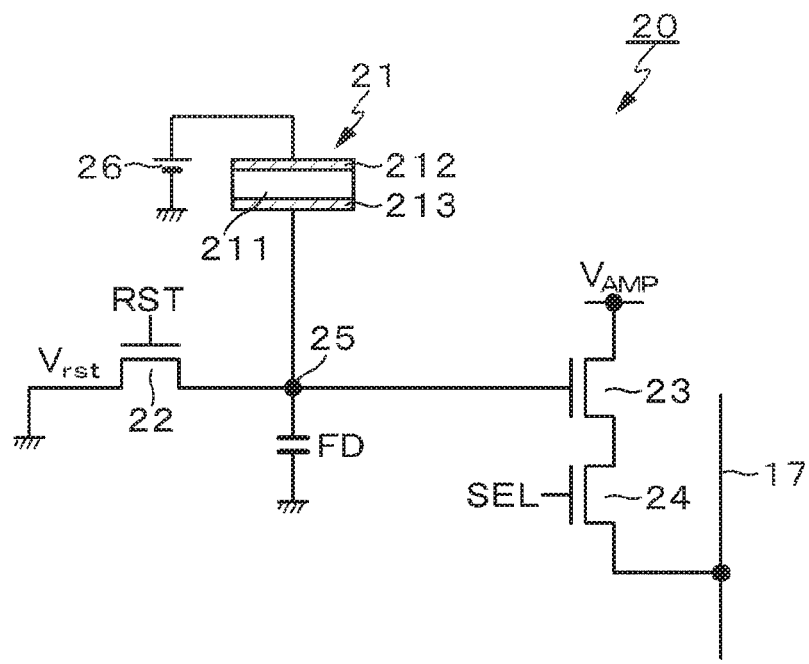
FIGS. 2A and 2B are circuit diagrams illustrating a circuit configuration example of a pixel using an organic photoelectric conversion film as a photoelectric conversion unit.

Hereinafter, embodiments of the technology of the present disclosure (hereinafter, embodiment(s)) will be described in detail with reference to the drawings. The technology of the present disclosure is not limited to the embodiments, and various materials, or the like, of the embodiment are examples. In the following description, the same elements or elements having the same function will be denoted by the same reference symbols, and duplicated description will be omitted. Note that description will be presented in the following order.

1. General description related to solid-state imaging element, signal processing circuit, and electronic device of the present disclosure
2. Solid-state imaging element to which technology of the present disclosure is applied
2-1. Basic system configuration
2-2. Pixel circuit (example using organic photoelectric conversion film in photoelectric conversion unit)
2-3. Voltage drop in floating diffusion unit
3. Embodiments of the present disclosure
3-1. Example 1 (example in which first wiring and second wiring are stacked in different layers)
3-2. Example 2 (example in which first wiring and second wiring are arranged in parallel in same layer)
3-3. Example 3 (example in which first wiring and second wiring are arranged in parallel in different layers)
3-4. Example 4 (example of wiring material of first wiring, second wiring, and third wiring)
4. Vertical spectroscopic pixel structure
5. Electronic device according to the present disclosure (example of imaging apparatus)
6. Configuration applicable by the present disclosure <General Description Related to Solid-State Imaging Element and Electronic Device of the Present Disclosure>

In a solid-state imaging element and an electronic device of the present disclosure, it is possible to have a configuration in which a reset voltage is at a GND level when a charge accumulation unit accumulates holes, or in which the reset voltage is either a power supply voltage or a boosted voltage having a voltage value higher than the power supply voltage when the charge accumulation unit accumulates electrons.

In the solid-state imaging element and the electronic device of the present disclosure including the preferable configuration described above, it is possible to have a configuration in which the first wiring and the second wiring are formed in parallel in different wiring layers, or formed in parallel in a same wiring layer. Furthermore, it is possible to have a configuration in which any one of the first wiring, the second wiring, and the third wiring includes a wiring material different from the other wiring.

Furthermore, in the solid-state imaging element and the electronic device of the present disclosure including the preferable configuration described above, it is possible to have a vertical spectroscopic pixel structure in which at least two photoelectric conversion regions are stacked in a light incident direction in a semiconductor substrate on which pixels are formed. Furthermore, it is possible to adopt a configuration having a back-illuminated pixel structure.

<Solid-State Imaging Element to which Technology of the Present Disclosure is Applied>

The solid-state imaging element to which the technology of the present disclosure is applied will be described with reference to FIG. 1. FIG. 1 is a system configuration diagram illustrating a basic configuration of the solid-state imaging element to which the technology of the present disclosure is applied. Here, the solid-state imaging element according to the present application example will be described using an example of a CMOS image sensor which is one type of a solid-state imaging element of the X-Y address system.

[Basic System Configuration]

A solid-state imaging element 10 according to the present application example includes: a pixel array unit 11 formed on a semiconductor substrate (semiconductor chip) (not illustrated); and a peripheral circuit unit integrated on the semiconductor substrate same as the substrate including the pixel array unit 11. The peripheral circuit unit includes, for example, a vertical drive unit 12, a column processing unit 13, a horizontal drive unit 14, and a system control unit 15.

The solid-state imaging element 10 further includes a signal processing unit 18 and a data storage unit 19. The signal processing unit 18 and the data storage unit 19 may be mounted on the same substrate as the solid-state imaging element 10, or may be arranged on a substrate separate from the solid-state imaging element 10. Furthermore, processing of each of the signal processing unit 18 and the data storage unit 19 may be performed by an external signal processing unit provided on a substrate different from the solid-state imaging element 10, for example, by a digital signal processor (DSP) circuit or by software.

The pixel array unit 11 has a configuration including an array of pixels (unit pixel) 20 including a photoelectric conversion unit that performs photoelectric conversion and generates and accumulates photo-charge corresponding to the amount of received incident light, arranged in a row direction and a column direction, that is, two-dimensionally arranged in a matrix. Here, the row direction refers to a pixel arrangement direction in pixel rows (that is, a horizontal direction), while the column direction refers to a pixel arrangement direction in pixel columns (that is, a vertical direction).

With respect to the matrix of pixel arrangements in the pixel array unit 11, pixel drive lines 16 ($16_1$ to $16_m$) are wired in the row direction for each of pixel rows, while vertical signal lines 17 ($17_1$ to $17_n$) are wired in the column direction for each of pixel columns. The pixel drive line 16 transmits a drive signal output from the vertical drive unit 12 when driving the pixel 20. Although FIG. 1 illustrates a case where the pixel drive line 16 has a single wire, the number of wires is not limited to one. One end of the pixel drive line 16 is connected to an output terminal corresponding to each of rows of the vertical drive unit 12.

The vertical drive unit 12 includes a shift register, an address decoder, and the like, and drives each of the pixels 20 of the pixel array unit 11 simultaneously for all the pixels, or in units of rows, etc. That is, the vertical drive unit 12, together with the system control unit 15 that controls the vertical drive unit 12, has a configuration as a drive unit that drives each of the pixels 20 of the pixel array unit 11. Although illustration of a specific configuration is omitted, the vertical drive unit 12 has a configuration having two scanning systems, namely, a readout scanning system and a sweep scanning system, in typical cases.

The readout scanning system sequentially selects and scans the pixels 20 of the pixel array unit 11 in units of rows in order to read out signals from the pixels 20. The signal read out from the pixel 20 is an analog signal. The sweep scanning system applies sweep scanning ahead of the readout scanning by the time corresponding to the shutter speed onto the readout rows on which the readout scanning is performed by the readout scanning system.

Sweep scanning by the sweep scanning system is performed to sweep out unnecessary charges from the photoelectric conversion unit of the pixel 20 in the readout rows, whereby the photoelectric conversion unit is reset. Moreover, sweeping out (resetting) unnecessary charges by this sweep scanning system leads to electronic shutter operation. Here, the electronic shutter operation refers to operation of discarding photo-charge of the photoelectric conversion unit and starting a new exposure (start accumulation of photo-charge).

The signal read out by the readout operation by the readout scanning system corresponds to the amount of light received after the readout operation or the electronic shutter operation just before the readout operation. Moreover, the period from the readout timing by the immediately preceding readout operation or the sweep timing by the electronic shutter operation to the readout timing by the present readout operation is an exposure period of the photo-charge in the pixel 20.

The signal output from each of pixels 20 of the pixel row selectively scanned by the vertical drive unit 12 is input to the column processing unit 13 through each of the vertical signal lines 17 for each of pixel columns. For each of pixel columns of the pixel array unit 11, the column processing unit 13 performs predetermined signal processing on a signal output from each of pixels 20 of the selected row through the vertical signal line 17, and together with this, temporarily stores pixel signals after the signal processing.

Specifically, the column processing unit 13 performs signal processing at least including noise removal processing such as correlated double sampling (CDS) processing or double data sampling (DDS) processing. For example, the CDS processing is effective for removing pixel-specific fixed pattern noise such as reset noise and threshold variation of the amplification transistor in the pixel 20. In addition to the noise removal processing, the column processing unit 13 may include an analog-to-digital (AD) conversion function, and an analog pixel signal can be converted into a digital signal and output, for example.

The horizontal drive unit 14 includes a shift register, an address decoder, or the like, and sequentially selects unit circuits corresponding to the pixel columns of the column processing unit 13. Along with the selective scanning by the horizontal drive unit 14, the column processing unit 13 sequentially outputs pixel signals subjected to signal processing for each of unit circuits.

The system control unit 15 includes a timing generator that generates various timing signals and the like, and controls driving of the vertical drive unit 12, the column processing unit 13, and the horizontal drive unit 14, or the like on the basis of various timing generated by the timing generator.

The signal processing unit 18 includes at least an arithmetic processing function and performs various signal processing such as arithmetic processing on the pixel signal output from the column processing unit 13. The signal processing unit 18 is an example of the signal processing circuit of the present disclosure, and its details will be described later. The data storage unit 19 temporarily stores data necessary for signal processing in the signal processing unit 18.

Note that the above-described system configuration is merely an example, and the present invention is not limited to this configuration. For example, it is allowable to have a system configuration in which the data storage unit 19 is arranged downstream of the column processing unit 13 and pixel signals output from the column processing unit 13 are supplied to the signal processing unit 18 via the data storage unit 19. Alternatively, it is allowable to have a system configuration in which the column processing unit 13 includes an AD conversion function of performing AD conversion for each of columns or a plurality of columns of the pixel array unit 11, and in which the data storage unit 19 and the signal processing unit 18 are installed in parallel with respect to the column processing unit 13.

The solid-state imaging element 10 to which the technology of the present disclosure is applied can have a structure in which constituents such as the column processing unit 13, the signal processing unit 18, or the data storage unit 19 are mounted on a same semiconductor substrate together with the pixel array unit 11, that is, a lay-flat structure. Alternatively, it would be possible to have a structure in which constituents such as the column processing unit 13, the signal processing unit 18, or the data storage unit 19, are dispersedly mounted on one or more other semiconductor substrates different from the semiconductor substrate on which the pixel array unit 11 is mounted, and these semiconductor substrates are stacked, namely, possible to have a stacked structure.

Furthermore, the pixel structure can either be a back-illuminated pixel structure or a surface-illumined pixel structure. Here, the "back-illuminated pixel structure" represents a pixel structure that captures incident light (light is emitted) from a substrate back side (backside of semiconductor substrate), that is, opposite to the substrate front side in which wiring layer of the semiconductor substrate is formed. In contrast, the "front-illuminated pixel structure" refers to a pixel structure that captures incident light (light is emitted) from the substrate front side.

[Pixel Circuit]

Figure 2B:
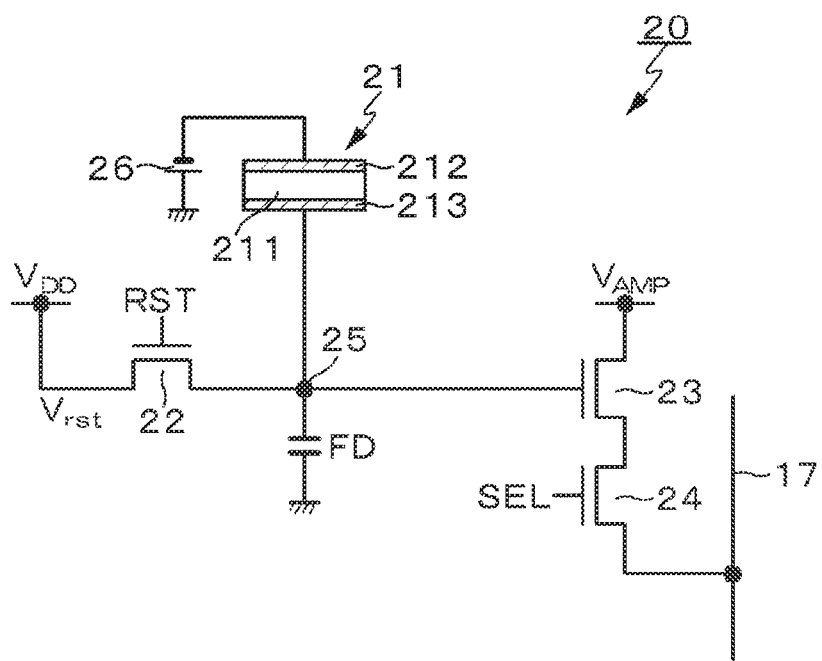

Here, the following is an example of the pixel 20 having a pixel circuit in which an organic photoelectric conversion film is used in the photoelectric conversion unit. FIGS. 2A and 2B are circuit diagrams illustrating a circuit configuration example of the pixel 20 using an organic photoelectric conversion film in a photoelectric conversion unit. The pixel 20 according to the present configuration example includes a reset transistor 22, an amplification transistor 23, and a selection transistor 24 in addition to a photoelectric conversion unit 21.

Here, each of the reset transistor 22, the amplification transistor 23, and the selection transistor 24 uses an N channel MOS transistor, for example. However, the combination of the conductivity types of the reset transistor 22, the amplification transistor 23, and the selection transistor 24 exemplified here is merely an example, and the combination is not limited to this example.

The photoelectric conversion unit 21 includes an organic photoelectric conversion film 211. The organic photoelectric conversion film 211 is sandwiched between an upper electrode 212 and a lower electrode 213. In this photoelectric conversion unit 21, at least the lower electrode 213 is divided for each of pixels. The lower electrode 213 is electrically connected to a floating diffusion unit (FD unit) 25. The FD unit 25 serves as a charge accumulation unit/ charge voltage conversion unit configured to accumulate charges and convert the accumulated charges into voltage. A bias voltage is applied to the upper electrode 212 by a bias power supply 26.

The reset transistor 22 has one source/drain electrode connected to the ground (GND), for example, and has the other source/drain electrode connected to the FD unit 25. To a gate electrode of the reset transistor 22, a reset pulse RST having high level being active is given from the vertical drive unit 12 illustrated in FIG. 1. The reset transistor 22 turns to a conducting state in response to the reset pulse RST and then, discards the charge of the FD unit 25 to GND and thereby resets the FD unit 25.

The amplification transistor 23 has the gate electrode connected to the FD unit 25 and has one source/drain electrode connected to a pixel power supply $V_{AMP}$ (for example, a power supply line of the power supply voltage $V_{DD}$). The amplification transistor 23 serves as an input part of a source follower that reads out a signal obtained by photoelectric conversion by the photoelectric conversion unit 21. That is, the amplification transistor 23 has the other source/drain electrode connected to the vertical signal line 17 via the selection transistor 24, thereby constituting a current source (not illustrated) and a source follower connected to one end of the vertical signal line 17.

The selection transistor 24 is connected in series with the amplification transistor 23 between the pixel power supply $V_{AMP}$ and the vertical signal line 17. Specifically, for example, one source/drain electrode of the selection transistor 24 is connected to the other source/drain electrode of the amplification transistor 23, while the other source/drain electrode is connected to the vertical signal line 17. To the gate electrode of the selection transistor 24, a selection pulse SEL having high level being active is given from the vertical drive unit 12. The selection transistor 24 is turned to a conduction state in response to the selection pulse SEL and thereby relays a signal output from the amplification transistor 23 to the vertical signal line 17 with the pixel 20 in a selected state.

In the pixel 20 having the above-described configuration, charges photoelectrically converted by the organic photoelectric conversion film 211 of the photoelectric conversion unit 21 are accumulated in the FD unit 25. Here, depending on the polarity of the bias voltage applied from the bias power supply 26 to the upper electrode 212, the charges accumulated in the FD unit 25 can either be electrons or holes.

Specifically, as illustrated in FIG. 2A, in a case where the polarity of the bias voltage applied to the upper electrode 212 by the bias power supply 26 is positive, the holes move to the lower electrode 213 and are then accumulated in the FD unit 25, while electrons move to the upper electrode 212, out of the charges generated in the organic photoelectric conversion film 211. In this case, in order to reset the FD unit 25 in which holes are accumulated, a reset voltage $V_{rst}$ at the time when the FD unit 25 is reset by the reset transistor 22 is set to the GND level as illustrated in FIG. 2A.

In contrast, as illustrated in FIG. 2B, in a case where the polarity of the bias voltage applied to the upper electrode 212 by the bias power supply 26 is negative, the electrons move to the lower electrode 213 and are then accumulated in the FD unit 25, while holes move to the upper electrode 212, out of the charges generated in the organic photoelectric conversion film 211. In this case, in order to reset the FD unit 25 in which electrons are accumulated, the reset voltage $V_{rst}$ at the time when the FD unit 25 is reset by the reset transistor 22 is set to the power supply voltage $V_{DD}$ (or a boosted voltage having a voltage value higher than the power supply voltage $V_{DD}$) as illustrated in FIG. 2B,

[Voltage Drop in FD Unit]

Figure 3:
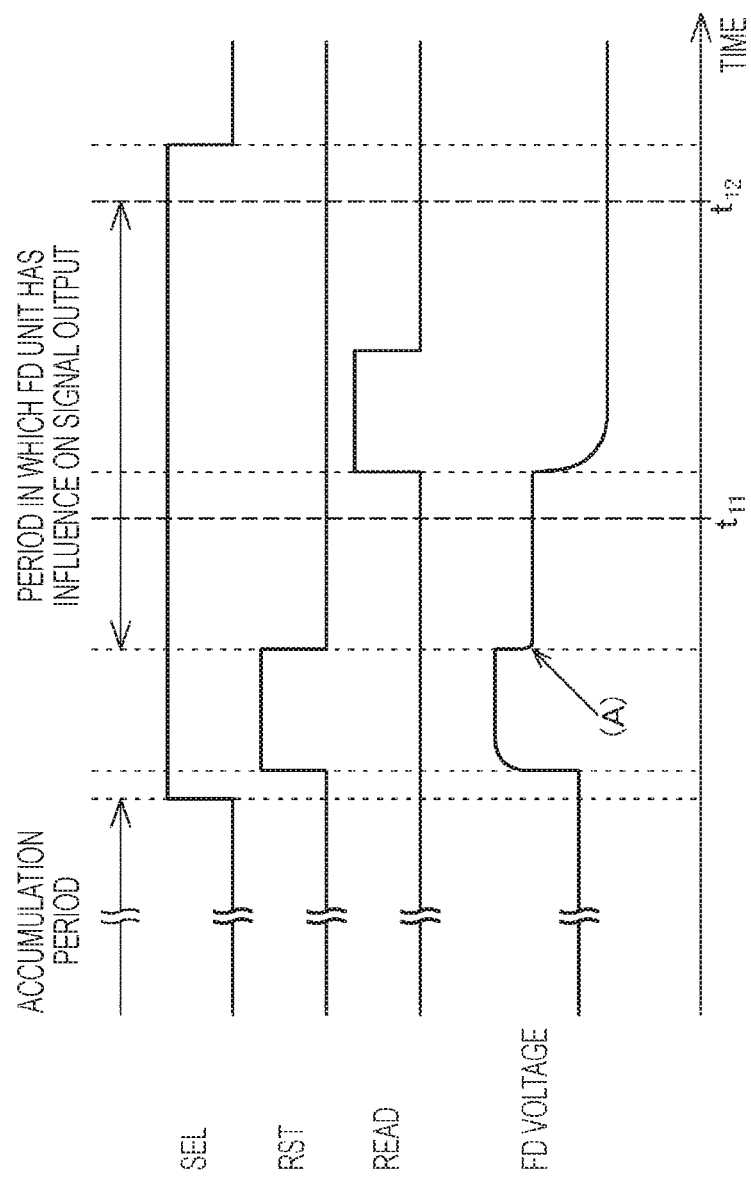
FIG. 3 is a timing waveform diagram illustrating a timing relationship of pixel drive in a typical CMOS image sensor.

Here, the drop in the voltage (FD voltage) of the FD unit 25 will be described. First, a case of a typical CMOS image sensor using a photodiode as a photoelectric conversion unit will be described with reference to FIG. 3. FIG. 3 is a timing waveform diagram illustrating a timing relationship of pixel drive of a typical CMOS image sensor.

In the timing waveform diagram of FIG. 3, READ is a readout pulse for driving a readout transistor (transfer transistor) that reads out charges from the photodiode. Moreover, a signal after reset of the FD unit 25 is read out at time $t_{11}$, and a signal is read out at time $t_{12}$ after the charge has been read out from the photodiode to the FD unit 25.

In a typical CMOS image sensor, the FD unit 25 is in a floating state when the reset pulse RST transitions to an inactive state (low level state in this example) after the FD unit 25 is reset. Accordingly, feedthrough corresponding to the capacitive coupling lowers the voltage of the FD unit 25.

Furthermore, when the reset pulse RST is returned to the inactive state, charge injection, that is, a phenomenon in which electrons existing in a channel of the reset transistor 22 are injected into the FD unit 25 also occurs, and this phenomenon lowers the FD voltage in a similar manner. In the timing waveform diagram of FIG. 3, (A) indicates a state in which the FD voltage drops due to the influence of the feedthrough of the reset pulse RST and the charge injection in the reset transistor 22. Drop of the FD voltage would deteriorate readout of electrons from the photodiode.

As described above, in a typical CMOS image sensor, only the feedthrough of the reset pulse RST and the charge injection in the reset transistor 22 have influence of the voltage drop after the FD unit 25 is reset. Furthermore, in a typical CMOS image sensor, since the signal charge stays in the FD unit 25 for several p seconds and thus, the FD unit 25 is not easily influenced by electric field dark current such as junction leakage. From the viewpoint of dark current, adjusting the FD voltage after feedthrough and charge injection so as to be a certain voltage has no high requirement.

Figure 4:
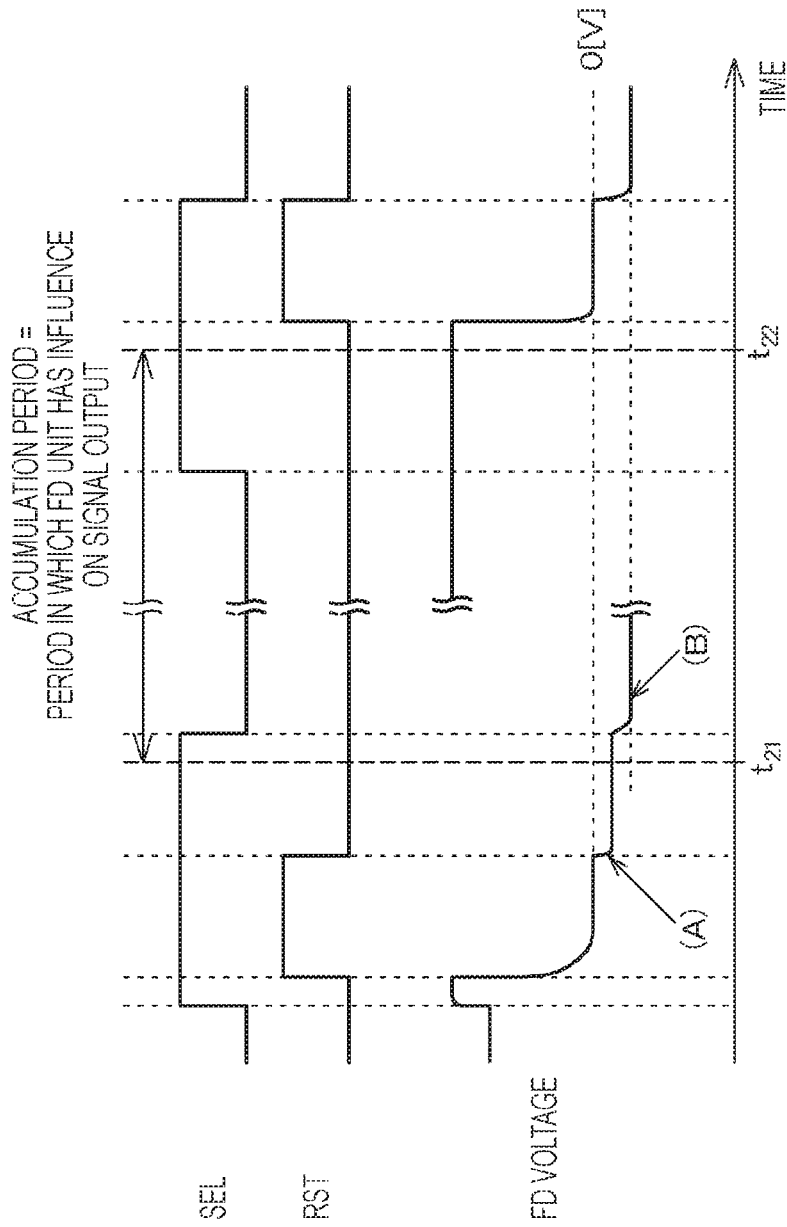
FIG. 4 is a timing waveform diagram illustrating a timing relationship of pixel drive in a case where charges are accumulated in an FD unit using an organic photoelectric conversion film in a photoelectric conversion unit.

Next, a voltage drop in the FD unit 25 in a case where the charge accumulation unit cannot be depleted, for example, in the case of the pixel configuration illustrated in FIGS. 2A and 2B in which charges are accumulated in the FD unit 25 by using the organic photoelectric conversion film 211 in the photoelectric conversion unit 21 will be described with reference to FIG. 4. FIG. 4 is a timing waveform diagram illustrating a timing relationship of pixel drive in the case of accumulating charges in the FD unit 25 by using the organic photoelectric conversion film 211 in the photoelectric conversion unit 21.

With the configuration in which the signal charge is accumulated in the FD unit 25 by using the organic photoelectric conversion film 211 in the photoelectric conversion unit 21, the dark current of the FD unit 25 is also accumulated together with accumulation of the signal charge, and therefore, there is a need to weaken the electric field of the FD unit 25 in particular. One way to weaken the electric field of the FD unit 25 is to reset the FD unit at the ground (GND) level as illustrated in FIG. 2A so as to turn the accumulated charge to a hole. This makes it possible to weaken the electric field of the FD unit 25 particularly in the dark time.

However, the feedthrough of the reset pulse RST and the charge injection in the reset transistor 22 lowers the FD voltage from the GND level and this generates an electric field, leading to an increase in the dark current of the FD unit 25. Furthermore, in the configuration in which the signal charge is accumulated in the FD unit 25 by using the organic photoelectric conversion film 211, the time interval ($t_{22}$–$t_{21}$ interval) of the CDS processing of the signals before and after the charge accumulation becomes equal to the accumulation time of the signal, as illustrated in the timing waveform diagram of FIG. 4.

Here, the time $t_{21}$ is a timing of reading out the signal (reset level) after the FD unit 25 is reset, while the time $t_{22}$ is a timing of reading out the signal (signal level) after the charges accumulated in the FD unit 25 are read out. Furthermore, the CDS processing is processing of capturing the reset level and the signal level output from the pixel 20 and taking a difference between these levels and thereby removing the reset noise of the pixel 20 (noise removal processing)

In this manner, in the case of using a configuration in which the signal charge is accumulated in the FD unit 25 by using the organic photoelectric conversion film 211, the time interval of the CDS processing is equal to the accumulation time of the signal. Accordingly, the selection pulse SEL is set in an inactive state (low level state in this example) after the reset level before accumulation is read out, and then goes into a long accumulation phase (accumulation period) as illustrated in the timing waveform diagram of FIG. 4.

With this arrangement, with a configuration in which the signal charge is accumulated in the FD unit 25 by using the organic photoelectric conversion film 211, the feedthrough by the selection pulse SEL would have an influence in addition to the feedthrough by the reset pulse RST and the channel charge injection in the reset transistor 22. Since both of them would lower the FD voltage, the influence of the dark current of the FD unit 25 would be more serious.

In the timing waveform diagram of FIG. 4, (A) illustrates a state where the FD voltage drops due to the influence of the feedthrough of the reset pulse RST and the charge injection in the reset transistor 22. Furthermore, (B) illustrates a state where the FD voltage further drops due to the influence of the feedthrough caused by the selection pulse SEL. In order to avoid the influence of these, it is conceivable to adjust the voltage value of the reset voltage $V_{rst}$ in consideration of the feedthrough amount. However, it is necessary to consider the influence of an increase in cost and power consumption to be caused by an increase in bias voltage and the number of power supply units, for example.

<Embodiment of Present Disclosure>

Therefore, in the embodiment of the present disclosure, an effect of boosting the FD voltage is to be positively utilized against the problem of the FD voltage drop after the time point when the selection pulse SEL turns to the inactive state. Specifically, second wiring is formed along the first wiring in the vicinity of the first wiring electrically connecting the FD unit 25 being a charge accumulation unit and the gate electrode of the amplification transistor 23. Subsequently, the second wiring is electrically connected to a common connection node of the amplification transistor 23 and the selection transistor 24 (connection part between the source of the amplification transistor 23 and the drain of the selection transistor 24).

Furthermore, the amplification transistor 23 and the selection transistor 24 are electrically connected to each other by third wiring. More specifically, a source region (diffusion layer) of the amplification transistor 23 and a drain region (diffusion layer) of the selection transistor 24 are separated from each other, and then, the third wiring is used to electrically connect the source region of the amplification transistor 23 and the drain region of the selection transistor 24. Each of the first wiring, the second wiring, and the third wiring includes metal wiring.

Figure 5A:
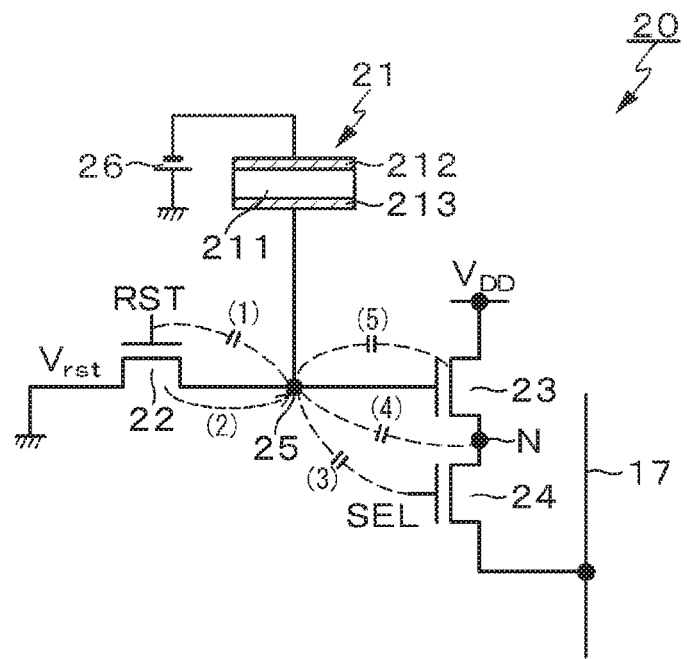
FIGS. 5A and 5B are view illustrating a factor of lowering the voltage of the floating diffusion unit and an action of boosting the voltage.

In the pixel circuit illustrated in FIG. 5A (same as the pixel circuit in FIG. 2A), (1) to (3) indicate factors for lowering the FD voltage. Specifically, (1) indicates feedthrough by the reset pulse RST, (2) indicates channel charge injection in the reset transistor 22, and (3) indicates feedthrough by the selection pulse SEL. N is a common connection node of the amplification transistor 23 and the selection transistor 24. Hereinafter, the common node will be simply described as the "node N" in some cases.

Figure 5B:
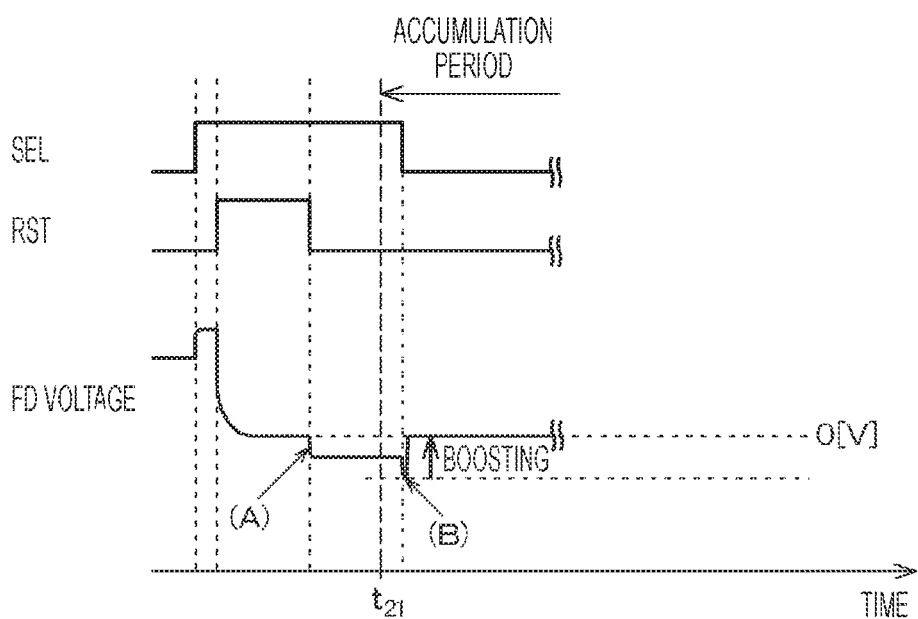

Now, as illustrated in the timing waveform diagram of FIG. 5B, when the reset pulse RST transitions to the inactive state after the FD unit 25 is reset, the FD voltage drops due to the influence of the feedthrough (1) by the reset pulse RST and the channel charge injection (2) in the reset transistor 22. Furthermore, after the reset level is read out, the FD voltage further drops due to the influence of the feedthrough (3) by the selection pulse SEL when the selection pulse SEL transitions to the inactive state and goes into the accumulation phase (accumulation period).

To avoid this, the embodiment of the present disclosure has a configuration in which the second wiring connected to the node N is provided in the vicinity of and along the first wiring (FD wiring) connecting the FD unit 25 with the gate electrode of the amplification transistor 23. With this configuration, the capacitive coupling through the parasitic capacitance between the first wiring and the second wiring can be increased. Accordingly, it is possible to cause the capacitance coupling to boost the FD voltage that has dropped by factors (1) to (3) and to adjust the FD voltage to an appropriate value.

More specifically, in the pixel circuit illustrated in FIG. 5A, there are effects of the boosting effect (4) by the capacitive coupling after the transition of the selection pulse SEL to the inactive state and the boosting effect (5) obtained by the channel of the amplification transistor 23 after the transition to the inactive state, and because of these effects, it is possible to boost the FD voltage and adjust it to an appropriate value. Moreover, capability of adjusting the FD voltage to an appropriate value would lead to execution of satisfactory readout of the charge from the photoelectric conversion unit 21, enabling enhancement of the image quality of the captured image.

Furthermore, since the amplification transistor 23 and the selection transistor 24 are connected to each other by the third wiring rather than connected by a shared diffusion layer, it is possible to improve the degree of freedom of arrangement of the selection transistor 24, making it possible to arrange the selection transistor 24 at a position distant from the FD unit 25. With this configuration, it is possible to suppress the FD voltage drop due to the influence of the feedthrough (3) by the selection pulse SEL, as compared with the case where the diffusion layer is shared.

Here, boosting of the FD voltage by the boosting effects (4) and (5) will be described in more detail. In an active period of the selection pulse SEL (high level state in this example), a path from the other source/drain electrode (source electrode in this example) of the amplification transistor 23 through the selection transistor 24 to the vertical signal line 17 is biased as an output of the source follower with the FD voltage as an input. Therefore, the voltage of the common connection node of the amplification transistor 23 and the selection transistor 24, that is, the voltage of the node N is lower than the power supply voltage $V_{DD}$.

Thereafter, when the selection pulse SEL transitions from the active state to the inactive state, electrons in the channel of the amplification transistor 23 and the electrons at the node N escape to the power supply voltage $V_{DD}$ side, causing an increase in the voltage at the node N. The effect (4) of the escape of the electrons in the channel of the amplification transistor 23 to the power supply voltage $V_{DD}$ side can be used to boost the FD voltage by capacitive coupling of a gate oxide film of the amplification transistor 23.

Furthermore, since the capacitive coupling with the FD unit 25 can be strengthened by connecting the amplification transistor 23 and the selection transistor 24 with metal wiring being the third wiring, or by drawing out the metal wiring, it is possible to obtain high degree of freedom of design. Furthermore, increasing the capacitance of the FD unit 25 would normally decrease the charge-voltage conversion efficiency at the FD unit 25. However, the node N is the output node of the source follower, and its capacitance is as small as (1−α) times due to the Miller effect. Here, α is the gain of the source follower. Furthermore, the portion coupled with the other node can be coupled to the node N, making it possible to obtain shielding effects of reducing the total capacity, leading also to charge-voltage conversion efficiency in the FD unit 25.

The above effects would be particularly effective for the solid-state imaging element 10 illustrated in FIG. 2A, that accumulates charges (holes) in the FD unit 25 and reset the FD unit 25 at the GND level. In addition, even in a case where charge accumulation is not performed in the FD unit 25 and the boosting effect at the time of transition of the selection pulse SEL to the inactive state cannot be obtained as in a typical CMOS image sensor, effects of obtaining enhanced charge-voltage conversion efficiency in the FD unit 25 are still expected. Accordingly, this can be defined as an effective means for solid-state imaging elements in general.

Hereinafter, specific examples of the wiring structure of the first wiring, the second wiring, and the third wiring will be described.

Example 1

Figure 6A:
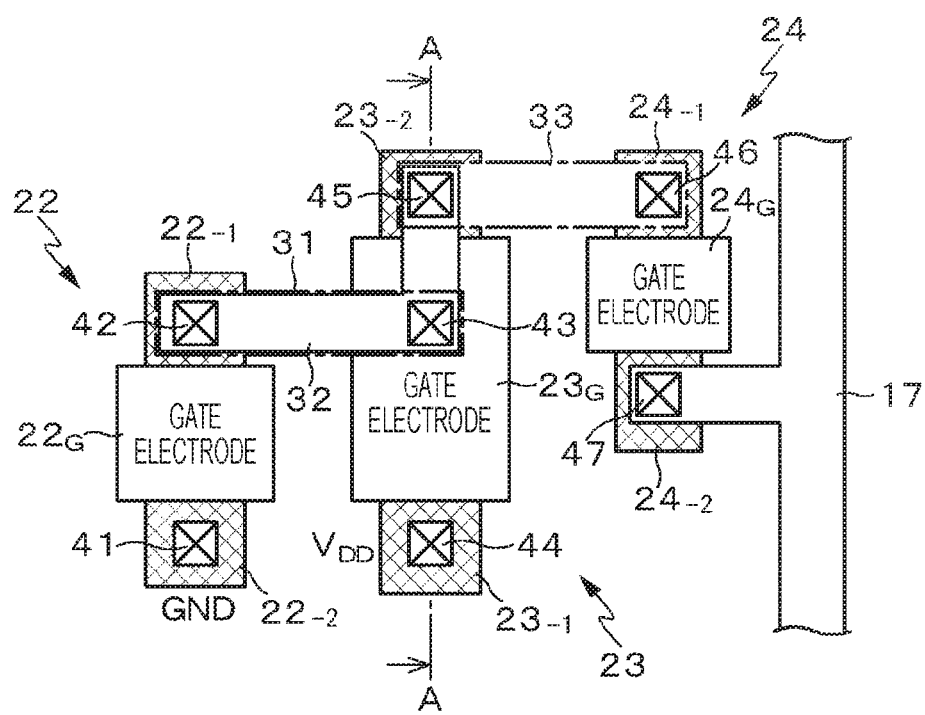
FIG. 6A is a plan view schematically illustrating a wiring structure according to Example 1.
Figure 6B:
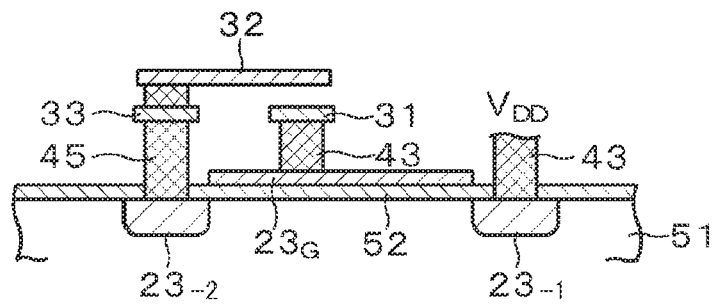
FIG. 6B is a cross-sectional view taken along line A-A of FIG. 6A.

Example 1 is an example of arranging the first wiring and the second wiring stacked on different layers. FIG. 6A is a plan view of a wiring structure according to Example 1, and FIG. 6B is a cross-sectional view taken along line A-A of FIG. 6A. Here, while an exemplary case of a pixel circuit illustrated in FIG. 2A in which the reset voltage $V_{rst}$ of the FD unit 25 is set to the GND level is illustrated, the pixel circuit illustrated in FIG. 2B in which the reset voltage $V_{rst}$ is set to the power supply voltage $V_{DD}$ has basically the similar wiring structure. This similarly applies to Examples to be described in the following.

In the reset transistor 22, one diffusion layer (source/drain region) $22_{-1}$ side is the FD unit 25 and the other diffusion layer (source/drain region) $22_{-2}$ is provided with the GND level via a contact part 41. In the case of the pixel circuit illustrated in FIG. 2B, the power supply voltage $V_{DD}$ is applied to the other diffusion layer $22_{-2}$. Meanwhile, one end of a first wiring 31 is electrically connected to one diffusion layer $22_{-1}$ on the FD unit 25 side via a contact part 42.

The first wiring 31 is formed in the first wiring layer, for example, with the other end electrically connected to a gate electrode 23G of the amplification transistor 23 via a contact part 43. The gate electrode 23G of the amplification transistor 23 is formed on the semiconductor substrate 51 via a gate oxide film 52.

In the amplification transistor 23, the power supply voltage $V_{DD}$ is applied to one diffusion layer (source/drain region) $23_{-1}$ via a contact part 44. Meanwhile, one end of a second wiring 32 is electrically connected to the other diffusion layer (source/drain region) $23_{-2}$ via a contact part 45. The second wiring 32 is formed in an L shape in a plan view in the second wiring layer, for example, such that the other end side of the second wiring 32 extends along the first wiring 31. Moreover, one end of a third wiring 33 is electrically connected to the other diffusion layer $23_{-2}$ of the amplification transistor 23 via the contact part 45.

The third wiring 33 is formed in the first wiring layer, for example, with the other end electrically connected to one diffusion layer (source/drain region) $24_{-1}$ of the selection transistor 24 via a contact part 46. That is, the amplification transistor 23 and the selection transistor 24 are electrically connected by the third wiring 33, rather than by sharing the diffusion layer $23_{-2}$ and the diffusion layer $24_{-1}$. The other diffusion layer (source/drain region) $24_{-2}$ of the selection transistor 24 is electrically connected to the vertical signal line 17 via a contact part 47.

In order to clarify the difference of wiring in the pixel structure illustrated in FIG. 6A, the first wirings 31 and the third wiring 33 being wiring of the first layer are indicated by one-dot chain lines, while the second wiring 32 being wiring in the second layer and the signal line 17 are illustrated by solid lines.

As described above, the wiring structure according to Example 1 is a wiring structure in which the second wiring 32 connected to the other diffusion layer $23_{-2}$ of the amplification transistor 23 is stacked and formed along the first wiring 31 that connects the FD unit 25 and the gate electrode 23G of the amplification transistor 23, in different wiring layers. With this configuration, capacitive coupling through the parasitic capacitance between the first wiring 31 and the second wiring 31 can be increased, making it possible to boost the FD voltage by the capacitive coupling.

Furthermore, there is provided a wiring structure that connects the amplification transistor 23 and the selection transistor 24 by using the third wiring 31 rather than connecting by sharing the diffusion layers (the diffusion layer $23_{-2}$ and the diffusion layer $24_{-1}$). This structure increases the degree of freedom of the layout of the selection transistor 24 and allows the selection transistor 24 to be arranged at a position distant from the FD unit 25, making it possible to suppress the voltage drop of the FD unit 25 due to the influence of feedthrough caused by the selection pulse SEL.

Example 2

Figure 7A:
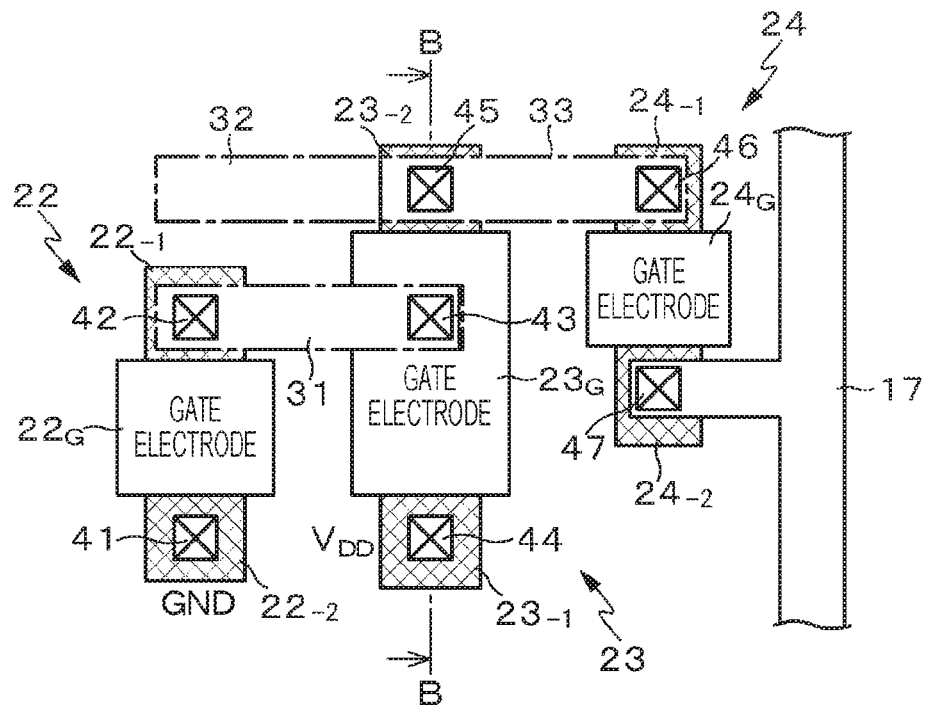
FIG. 7A is a plan view schematically illustrating a wiring structure according to Example 2.
Figure 7B:
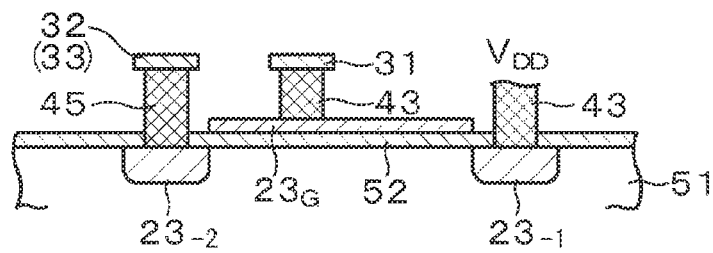
FIG. 7B is a cross-sectional view taken along line B-B of FIG. 7A.

Example 2 is an example in which the first wiring and the second wiring are arranged in parallel in a same layer. FIG. 7A is a plan view of the wiring structure according to Example 2, and FIG. 7B is a cross-sectional view taken along line B-B of FIG. 7A.

According to the wiring structure of Example 2, both the second wiring 32 and the third wiring 33 are formed in the same first wiring layer as the first wiring 31. Specifically, the first wiring 31 is formed in the first wiring layer, one end of which being electrically connected to the FD unit 25 via the contact part 42, while the other end is electrically connected to the gate electrode 23G of the amplification transistor 23 via the contact part 43.

The second wiring 32 is formed in parallel with the first wiring 31 in the first wiring layer, with one end of the second wiring 32 being electrically connected to the other diffusion layer $23_{-2}$ of the amplification transistor 23 via the contact part 45. Furthermore, the third wiring 33 is formed in the first wiring layer, while the other end is electrically connected to one diffusion layer $24_{-1}$ of the selection transistor 24 via the contact part 46.

In order to clarify the difference of wiring in the pixel structure illustrated in FIG. 7A, the first wiring 31, the second wiring 32, and the third wiring 33 being the first layer wiring are illustrated by one-dot chain lines, while the signal line 17 being the second layer wiring is illustrated by solid lines.

As described above, the wiring structure according to Example 2 is a wiring structure in which the second wiring 32 connected to the other diffusion layer $23_{-2}$ of the amplification transistor 23 is formed in parallel along the first wiring 31 that connects the FD unit 25 and the gate electrode 23G of the amplification transistor 23, in a same wiring layer. In the case of this wiring structure, the first wiring 31 and the second wiring 32 are opposed to each other on the side surface. This makes it possible to boost the FD voltage by capacitive coupling through parasitic capacitance, although the parasitic capacitance between the first wiring 31 and the second wiring 31 is slightly reduced compared with the wiring structure according to Example 1 in which the first wiring 31 and the second wiring 32 are opposed with upper/lower surfaces.

Example 3

Figure 8A:
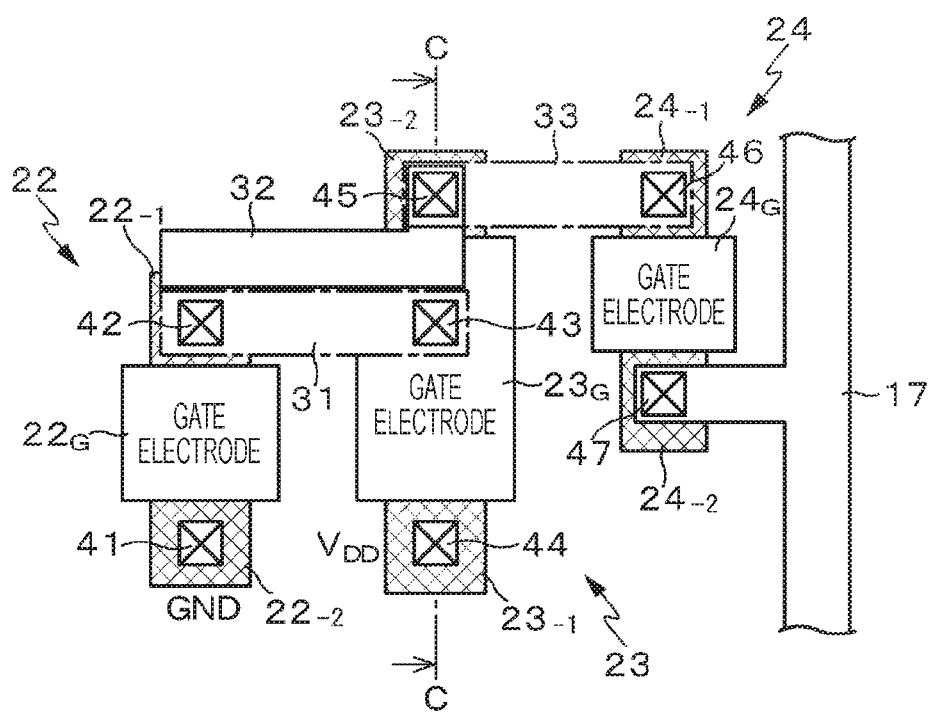
FIG. 8A is a plan view schematically illustrating a wiring structure according to Example 3.
Figure 8B:
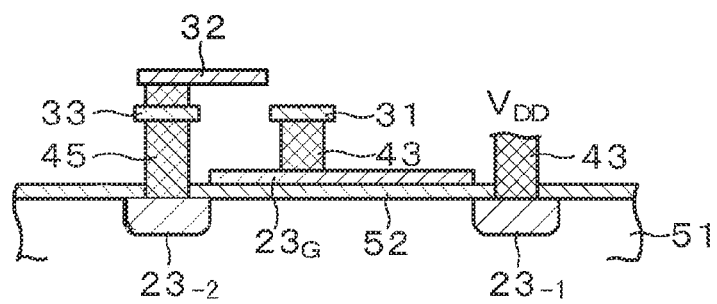
FIG. 8B is a cross-sectional view taken along line C-C of FIG. 8A.

Example 3 is a modification of Example 1. This is an example in which the first wiring and the second wiring are arranged in parallel in different layers. FIG. 8A is a plan view of the wiring structure according to Example 3, and FIG. 8B is a cross-sectional view taken along line C-C of FIG. 8A.

The wiring structure according to Example 1 is a wiring structure in which the first wiring 31 and the second wiring 32 are vertically stacked in different wiring layers. In contrast, the wiring structure according to Example 3 is a wiring structure in which the first wiring 31 and the second wiring 32 are formed in parallel in different wiring layers, in other words, formed in a positional relationship being adjacent to each other in parallel in the diagonal direction.

Specifically, the first wiring 31 is formed in the first wiring layer, one end of which being electrically connected to the FD unit 25 via the contact part 42, while the other end is electrically connected to the gate electrode 23G of the amplification transistor 23 via the contact part 43. The second wiring 32 is formed in parallel with the first wiring 31 in the second wiring layer, with one end of the second wiring 32 being electrically connected to the other diffusion layer $23_{-2}$ of the amplification transistor 23 via the contact part 45. Furthermore, the third wiring 33 is formed in the first wiring layer, while the other end is electrically connected to one diffusion layer $24_{-1}$ of the selection transistor 24 via the contact part 46.

As described above, the wiring structure according to Example 3 is a wiring structure in which the first wiring 31 and the second wiring 32 are adjacent to each other in the diagonal direction in different wiring layers and are arranged in parallel along the first wiring 31. In the case of this wiring structure, the first wiring 31 and the second wiring 32 are adjacent to each other in the diagonal direction. This makes it possible to boost the FD voltage by capacitive coupling through parasitic capacitance, although the parasitic capacitance between the first wiring 31 and the second wiring 31 is slightly reduced compared with the wiring structure according to Example 1 in which the first wiring 31 and the second wiring 32 are opposed with upper/lower surfaces.

Note that, in the wiring structures according to Examples 1 to 3, the first wiring 31, the second wiring 32, and the third wiring 33 may be formed by metal wiring including copper (Cu), aluminum (Al), or the like.

Example 4

Example 4 is an example of wiring materials of the first wiring 31, the second wiring 32, and the third wiring 33. While Examples 1 to 3 use the same wiring material as the first wiring 31, the second wiring 32, and the third wiring 33, it is allowable to use mutually different wiring materials. For example, in the wiring structure of Example 1, it is possible to use tungsten (W) as the wiring material of the first wiring 31, for example, and possible to use copper, aluminum, or the like, as the wiring material of the second wiring 32 and the third wiring 33. Conversely, it is possible to use copper, aluminum, or the like, as the wiring material of the first wiring 31 and possible to use tungsten (W) as the wiring material of the second wiring 32 and the third wiring 33, for example. Furthermore, the wiring material of the second wiring 32 and the third wiring 33 need not be the same, and can be mutually different wiring materials.

<Vertical Spectroscopic Pixel Structure>

There is a solid-state imaging element having a vertical spectroscopic pixel structure. This structure includes a photoelectric conversion film that performs photoelectric conversion on light in a predetermined wavelength zone provided outside a semiconductor substrate while including, inside the semiconductor substrate, at least two photoelectric conversion regions that perform photoelectric conversion on light in a wavelength region other than the predetermined wavelength zone having passed through the photoelectric conversion film.

According to the vertical spectroscopic pixel structure, it is possible to arrange photoelectric conversion units (photoelectric conversion films and photoelectric conversion regions) having sensitivity for two or more colors in the one pixel region. This is advantageous in enhancing light use efficiency compared with a case of disposing a photoelectric conversion unit having sensitivity for two or more colors in a planar manner. The technology of the present disclosure can also be applied to a solid-state imaging element having the vertical spectroscopic pixel structure.

Figure 9:
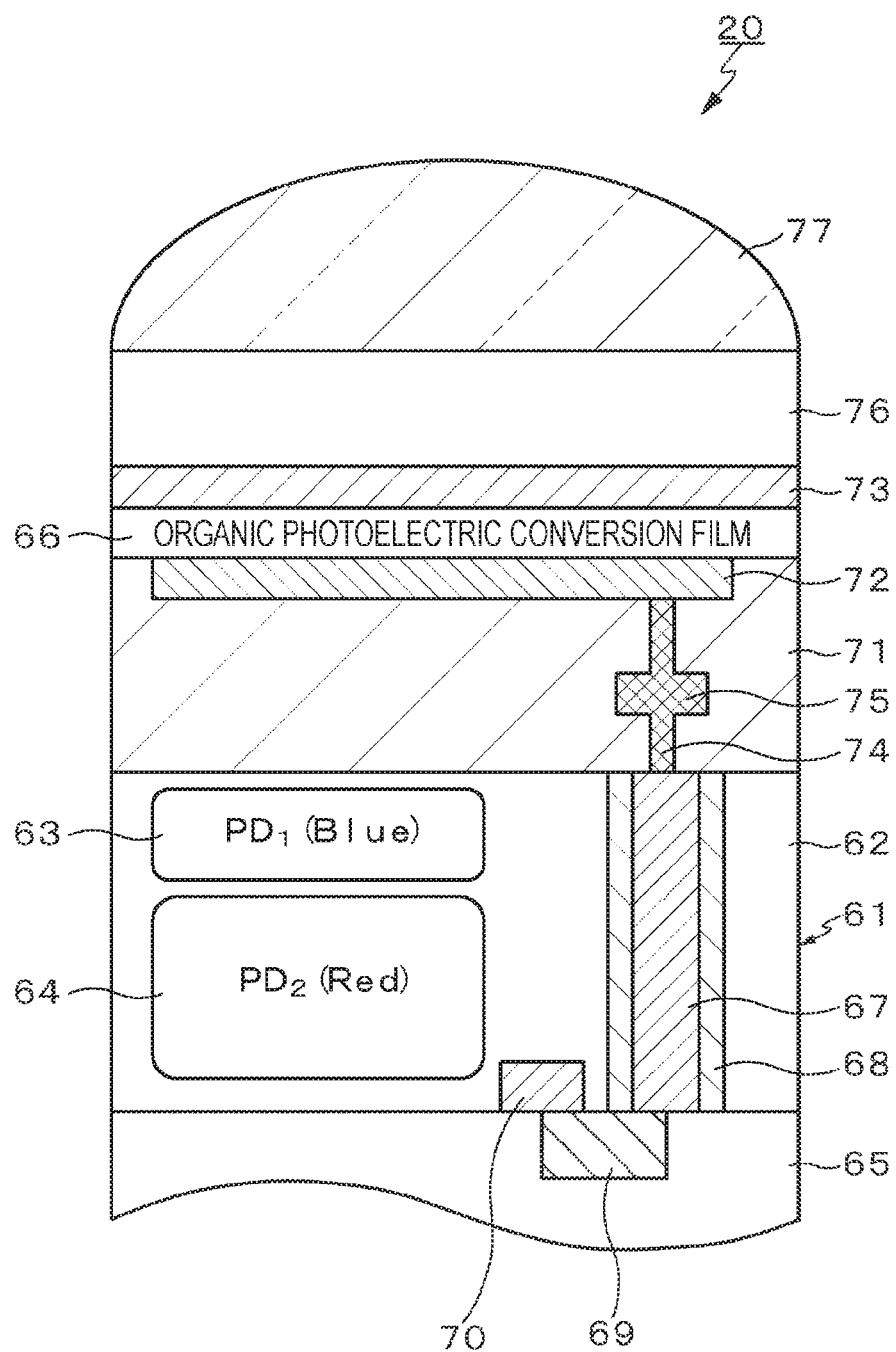
FIG. 9 is a cross-sectional view illustrating an example of a vertical spectroscopic pixel structure.

The vertical spectroscopic pixel structure will be described with reference to FIG. 9. FIG. 9 illustrates a vertical spectroscopic pixel structure.

In FIG. 9, a semiconductor region 63 and a semiconductor region 64 of the second conductivity type (for example, N type) are stacked and formed in a semiconductor region 62 of the first conductivity type (for example, P type) of the semiconductor substrate 61 in a substrate depth direction. This leads to formation of a photodiode $PD_1$ and a photodiode $PD_2$ by PN junction in a stacked state in the substrate depth direction. The photodiode $PD_1$ having the semiconductor region 63 as a charge accumulation region is an inorganic photoelectric conversion unit that receives blue light and performs photoelectric conversion, for example. The photodiode $PD_2$ having the semiconductor region 64 as a charge accumulation region is an inorganic photoelectric conversion unit that receives red light and performs photoelectric conversion, for example.

The front side (lower side in the drawing) of the semiconductor substrate 61 includes a multilayer wiring layer 65. The multilayer wiring layer 65 includes: a plurality of pixel transistors that performs readout, or the like, of the charges photoelectrically converted by the photodiode $PD_1$ and the photodiode $PD_2$ and accumulated; a plurality of wiring layers; and an interlayer insulation film. Note that FIG. 9 omits detailed illustration of the multilayer wiring layer 65.

The semiconductor substrate 61 includes a conductive plug 67 for extracting charges photoelectrically converted by an organic photoelectric conversion film 66 (corresponding to the organic photoelectric conversion film 211 in FIGS. 2A and 2B) described later, to the multilayer wiring layer 65 side. This conductive plug 67 is formed to penetrate the semiconductor region 62 within the semiconductor substrate 61. An outer periphery of the conductive plug 67 includes an insulation film 47 including $SiO_2$ or SiN provided in order to suppress a short circuit with the semiconductor region 62.

The conductive plug 67 is electrically connected to a floating diffusion unit 70 formed of a semiconductor region of the second conductivity type (for example, N type) in the semiconductor substrate 61 via metal wiring 69 formed in the multilayer wiring layer 65. The floating diffusion unit 70 is a charge voltage conversion unit that temporarily holds the charge photoelectrically converted by the organic photoelectric conversion film 52 and that converts the charge into a voltage.

An interface of the back side of the semiconductor substrate 61 (on the upper side/the side opposite to the side on which the multilayer wiring layer 65 is formed) includes a transparent insulating film 71 including a two-layer or three-layer film of a hafnium oxide ($HfO_2$) film and a silicon oxide film.

On the upper side of the transparent insulating film 71, the organic photoelectric conversion film 66 is sandwiched between a lower electrode 72 (corresponding to the lower electrode 213 in FIGS. 2A and 2B) and an upper electrode 73 (corresponding to the upper electrode 212 in FIGS. 2A and 2B). The organic photoelectric conversion film 66, the lower electrode 72, and the upper electrode 73 constitute an organic photoelectric conversion unit. The organic photoelectric conversion film 66 includes, for example, when used as a film that performs photoelectric conversion of light of green wavelength, organic photoelectric conversion materials including rhodamine-based pigments, merocyanine-based pigments, quinacridone, and the like, for example. The lower electrode 72 and the upper electrode 73 are formed of an indium tin oxide (ITO) film, an indium zinc oxide film, for example.

Note that in a case where the organic photoelectric conversion film 66 is used as a film that performs photoelectric conversion of red wavelength light, it is possible to use organic photoelectric conversion materials including phthalocyanine-based pigments, for example. Moreover, in a case where the organic photoelectric conversion film 66 is used as a film that performs photoelectric conversion of blue wavelength light, it is possible to use organic photoelectric conversion materials including coumarin-based pigments, tris-8-hydroxyquinoline-Al (Alq3), merocyanine-based pigments, and the like.

The upper electrode 73 is formed over the entire surface in common for all the pixels. In contrast, the lower electrode 72 is formed in pixel units, and is electrically connected to the conductive plug 67 of the semiconductor substrate 61 by the metal wiring 74 penetrating the transparent insulating film 71. The metal wiring 74 is formed of a material such as tungsten (W), aluminum (Al), and copper (Cu). The metal wiring 74 is also formed in a planar direction at a predetermined depth of the transparent insulating film 71 and also serves as an inter-pixel light shielding film 75 that suppresses incidence of light to adjacent pixels.

On an upper surface of the upper electrode 73, a high refractive index layer 76 is formed with an inorganic membrane including silicon nitride film (SiN), silicon oxynitride film (SiON), silicon carbide (SiC), or the like. Furthermore, an on-chip lens 77 is formed on the high refractive index layer 76. Examples of materials of the on-chip lens 77 include a silicon nitride film (SiN), or resin-based materials such as styrenic resin, acrylic resin, styrene-acrylic copolymer resin, or siloxane based resin. Since the present pixel structure has a short distance between the organic photoelectric conversion film 66 and the on-chip lens 77, interposing the high refractive index layer 76 would increase the refraction angle, leading to enhancement of the condensing efficiency.

As described above, the pixel structure according to the present configuration example is a back-illuminated pixel structure which light enters from the back side, that is, an opposite side of the multilayer wiring layer 65 side, defined as a front side of the semiconductor substrate 61, on which pixel transistors, wiring, and the like, are formed. Furthermore, the pixel structure is a vertical spectroscopic pixel structure that performs, for example, photoelectric conversion on the green light by the organic photoelectric conversion film 66 formed above the semiconductor substrate 61, and that performs photoelectric conversion on blue and red light by the photodiode $PD_1$ and the photodiode $PD_2$ within the semiconductor substrate 61.

<Electronic Device of the Present Disclosure>

The solid-state imaging element according to the embodiments described above is applicable as an imaging unit (image capture unit) in an imaging apparatus such as a digital still camera or a video camera, a mobile terminal apparatus having an imaging function such as a cellular phone, or in general electronic devices such as a copier using a solid-state imaging element in an image reading part. Note that the solid-state imaging element may be formed as a one-chip device, or may be provided in a module form having an imaging function as a package collectively including an imaging unit and a signal processing unit or an optical system. The module form mounted on the electronic device, that is, a camera module may be the imaging apparatus in some cases.

[Imaging Apparatus]

Figure 10:
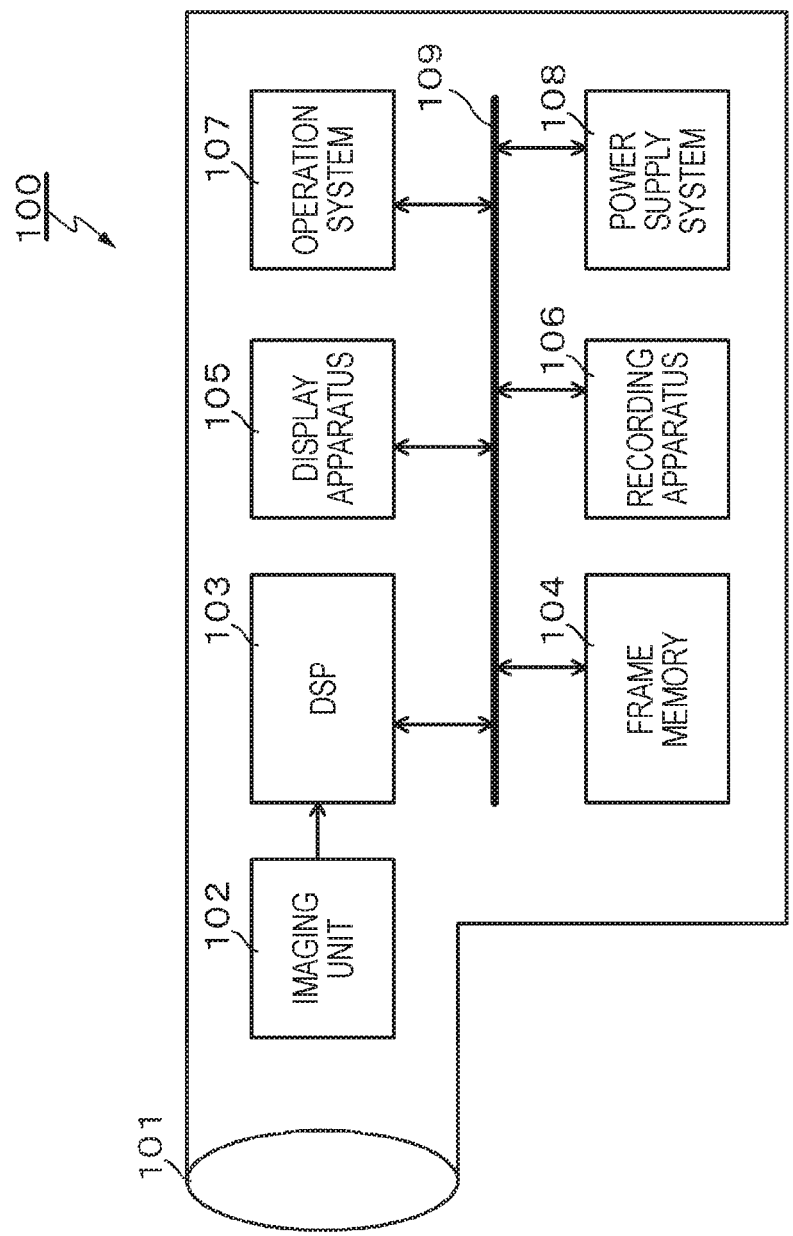
FIG. 10 is a block diagram illustrating a configuration of an imaging apparatus as an example of an electronic device of the present disclosure.

FIG. 10 is a block diagram illustrating a configuration of an imaging apparatus as an example of the electronic device of the present disclosure. As illustrated in FIG. 10, an imaging apparatus 100 according to the present example includes an imaging optical system 101 including a lens group, etc., an imaging unit 102, a DSP circuit 103, a frame memory 104, a display apparatus 105, a recording apparatus 106, an operation system 107, a power supply system 108, and the like. Among these, the DSP circuit 103, the frame memory 104, the display apparatus 105, the recording apparatus 106, the operation system 107, and the power supply system 108 are mutually connected via a bus line 109.

The imaging optical system 101 captures incident light (image light) from a subject and forms an image on an imaging surface of the imaging unit 102. The imaging unit 102 converts the light amount of the incident light imaged on the imaging surface by the optical system 101 into electric signals in pixel units and outputs the electric signals as pixel signals. The DSP circuit 103 performs general camera signal processing such as white balance processing and gamma correction processing, for example.

The frame memory 104 is used for storing data as appropriate during the signal processing in the DSP circuit 103. The display apparatus 105 is a panel type display apparatus such as a liquid crystal display apparatus or an organic electro luminescence (EL) display apparatus, and displays moving images or still images captured by the imaging unit 102. The recording apparatus 106 records the moving image or the still image captured by the imaging unit 102 on a recording medium such as a portable semiconductor memory, an optical disc, or hard disk drive (HDD).

The operation system 107 issues an operation command for various functions provided in the imaging apparatus 100 under the operation of the user. The power supply system 108 appropriately provides various types of power supply serving as operating power supply to the DSP circuit 103, the frame memory 104, the display apparatus 105, the recording apparatus 106, and the operation system 107 to these supply targets.

In the imaging apparatus 100 having the above configuration, the solid-state imaging element according to the above-described embodiment can be used as the imaging unit 102. The solid-state imaging element according to the above-described embodiment can adjust the FD voltage to an appropriate value, leading to execution of satisfactory readout of the charge from the photoelectric conversion unit, enabling enhancement of the image quality of the captured image. Therefore, with the use of the solid-state imaging element according to the above-described embodiment as the imaging unit 102, it is possible to capture an image with high image quality.

<Configuration Achievable by the Present Disclosure>

Note that the present disclosure can also be configured as follows.

[1] A solid-state imaging element having arranged inside a pixel:

a charge accumulation unit that accumulates a charge photoelectrically converted by a photoelectric conversion unit;

a reset transistor that selectively applies a reset voltage to the charge accumulation unit;

an amplification transistor having a gate electrode being electrically connected to the charge accumulation unit; and a selection transistor connected in series to the amplification transistor, the solid-state imaging element including:

first wiring electrically connecting the charge accumulation unit and the gate electrode of the amplification transistor;

second wiring electrically connected to a common connection node of the amplification transistor and the selection transistor and formed along the first wiring; and third wiring electrically connecting the amplification transistor and the selection transistor.

[2] The solid-state imaging element according to [1], in which, when the charge accumulation unit accumulates holes, the reset voltage is at a GND level.

[3] The solid-state imaging element according to [1], in which, when the charge accumulation unit accumulates electrons, the reset voltage is a power supply voltage or a boosted voltage having a voltage value higher than the power supply voltage.

[4] The solid-state imaging element according to any of [1] to [3], in which the first wiring and the second wiring are formed in parallel in different wiring layers.

[5] The solid-state imaging element according to any of [1] to [3],
in which the first wiring and the second wiring are formed in parallel in a same wiring layer.

[6] The solid-state imaging element according to any of [1] to [5],
in which wiring of any one of the first wiring, the second wiring, and the third wiring includes a wiring material different from the material of the other wiring.

[7] The solid-state imaging element according to any of [1] to [6],
in which the photoelectric conversion unit includes an organic photoelectric conversion film.

[8] The solid-state imaging element according to any of [1] to [7],
in which at least two photoelectric conversion regions are stacked in a light incident direction in a semiconductor substrate on which pixels are formed.

[9] The solid-state imaging element according to any of [1] to [8],
in which the pixel has a back-illuminated pixel structure.

[10] An electronic device including a solid-state imaging element having arranged inside a pixel:
a charge accumulation unit that accumulates a charge photoelectrically converted by a photoelectric conversion unit;
a reset transistor that selectively applies a reset voltage to the charge accumulation unit;
an amplification transistor having a gate electrode being electrically connected to the charge accumulation unit; and
a selection transistor connected in series to the amplification transistor,
the solid-state imaging element including:
first wiring electrically connecting the charge accumulation unit and the gate electrode of the amplification transistor;
second wiring electrically connected to a common connection node of the amplification transistor and the selection transistor and formed along the first wiring; and
third wiring electrically connecting the amplification transistor and the selection transistor.

REFERENCE SIGNS LIST

10 Solid-state imaging element
11 Pixel array unit
12 Vertical drive unit
13 Column processing unit
14 Vertical drive unit
15 System control unit
16($16_1$ to $16_m$) Pixel drive line
17($17_1$ to $17_n$) Vertical signal line
18 Signal processing unit
19 Data storage unit
20 Pixel (unit pixel)
21 Photoelectric conversion unit
22 Reset transistor
23 Amplification transistor
24 Selection transistor
25 Floating diffusion unit (FD unit)
26 Bias power supply
31 First wiring
32 Second wiring
33 Third wiring

The invention claimed is:

1. A light detecting device, comprising:
a first electrode;
a second electrode;
a photoelectric conversion layer between the first electrode and the second electrode;
a floating diffusion connected to one of the first electrode or the second electrode;
an amplification transistor having a gate electrode;
a selection transistor;
a first wiring connected to the floating diffusion and the gate electrode of the amplification transistor;
a second wiring connected to a common node of the amplification transistor and the selection transistor, wherein at least a part of the second wiring is along the first wiring; and
a third wiring connected to the amplification transistor and the selection transistor.

2. The light detecting device according to claim 1, wherein the first wiring and the second wiring are in parallel in different wiring layers.

3. The light detecting device according to claim 1, wherein the first wiring and the second wiring are in parallel in a same wiring layer.

4. The light detecting device according to claim 1, wherein a wiring material of one of the first wiring, the second wiring, or the third wiring is different.

5. The light detecting device according to claim 1, wherein the third wiring is configured to electrically connect a source region of the amplification transistor with a drain region of the selection transistor.

6. The light detection device according to claim 1, wherein each of the first wiring, the second wiring, and the third wiring includes a metal wiring.

7. The light detection device according to claim 1, further comprising a reset transistor that includes a third electrode and a fourth electrode, wherein
the third electrode is connected to the floating diffusion, and
the fourth electrode is connected to ground.

8. The light detecting device according to claim 1, wherein the selection transistor is connected in series with the amplification transistor.

9. The light detecting device according to claim 1, further comprising a vertical signal line connected to the selection transistor.

10. An electronic device, comprising:
a lens;
a signal processor; and
a light detection device that includes:
a first electrode;
a second electrode;
a photoelectric conversion layer between the first electrode and the second electrode;
a floating diffusion connected to one of the first electrode or the second electrode;
an amplification transistor having a gate electrode;
a selection transistor;
a first wiring connected to the floating diffusion and the gate electrode of the amplification transistor;
a second wiring connected to a common node of the amplification transistor and the selection transistor, wherein at least a part of the second wiring is along the first wiring; and
a third wiring connected to the amplification transistor and the selection transistor.

11. The electronic device according to claim 10, wherein the first wiring and the second wiring are in parallel in different wiring layers.

12. The electronic device according to claim 10, wherein the first wiring and the second wiring are in parallel in a same wiring layer.

13. The electronic device according to claim 10, wherein a wiring material of one of the first wiring, the second wiring, or the third wiring is different.

14. The electronic device according to claim 10, wherein the third wiring is configured to electrically connect a source region of the amplification transistor with a drain region of the selection transistor.

15. The electronic device according to claim 10, wherein each of the first wiring, the second wiring, and the third wiring includes a metal wiring.

16. The electronic device according to claim 10, further comprising a reset transistor that includes a third electrode and a fourth electrode, wherein the third electrode is connected to the floating diffusion, and the fourth electrode is connected to ground.

17. The electronic device according to claim 10, wherein the selection transistor is connected in series with the amplification transistor.

18. The electronic device according to claim 10, wherein the light detection device further includes a vertical signal line connected to the selection transistor.

* * * * *